United States Patent
Shioi

(10) Patent No.: US 7,675,083 B2
(45) Date of Patent: Mar. 9, 2010

(54) OXYNITRIDE-BASED FLUORESCENT MATERIAL AND METHOD FOR PRODUCTION THEREOF

(75) Inventor: Kousuke Shioi, Chiba (JP)

(73) Assignee: Showa Denko K.K., Tokyo (JP)

( * ) Notice: Subject to any disclaimer, the term of this patent is extended or adjusted under 35 U.S.C. 154(b) by 172 days.

(21) Appl. No.: 11/663,820

(22) PCT Filed: Sep. 28, 2005

(86) PCT No.: PCT/JP2005/018385

§ 371 (c)(1),
(2), (4) Date: May 24, 2007

(87) PCT Pub. No.: WO2006/035991

PCT Pub. Date: Jun. 4, 2006

(65) Prior Publication Data

US 2008/0029776 A1 Feb. 7, 2008

Related U.S. Application Data

(60) Provisional application No. 60/617,072, filed on Oct. 12, 2004.

(30) Foreign Application Priority Data

Sep. 29, 2004 (JP) .............................. 2004-284018

(51) Int. Cl.
*H01L 33/00* (2006.01)
(52) U.S. Cl. ..................... 257/98; 257/E33.061; 438/29
(58) Field of Classification Search .................. 257/98, 257/E33.061; 438/29
See application file for complete search history.

(56) References Cited

U.S. PATENT DOCUMENTS

| 7,351,356 B2* | 4/2008 | Delsing et al. ........ 252/301.4 S |
| 2004/0135504 A1* | 7/2004 | Tamaki et al. ............... 313/512 |
| 2005/0077500 A1* | 4/2005 | Sakai et al. ........... 252/301.4 R |
| 2005/0156496 A1* | 7/2005 | Takashima et al. .......... 313/237 |

FOREIGN PATENT DOCUMENTS

| JP | 2002-203991 A | 7/2002 |
| WO | WO 2004-030109 A1 | 4/2004 |

OTHER PUBLICATIONS

Takashi Mukai et al., *White and UV LEDs*, Department of Research and Development, Nichia Chemical Industries, Ltd., (491 Oka, Kaminaka, Anan) (1999).

\* cited by examiner

*Primary Examiner*—Tu-Tu V Ho
(74) *Attorney, Agent, or Firm*—Sughrue Mion, PLLC

(57) ABSTRACT

An oxynitride-based fluorescent material is formed of what results from substituting Eu for part of M of a general formula $M_3Si_2N_2O_4$, wherein M denotes one or more elements selected from among Be, Mg, Ca, Sr and Ba. The oxynitride-based fluorescent material can be produced by a method comprising mixing an oxide of Be, Mg, Ca, Sr, Ba or Eu, or a compound of Be, Mg, Ca, Sr, Ba or Eu enabled by heating to form an oxide, silicon nitride or a compound enabled by heating to form silicon nitride, and silicon oxide or a compound enabled by heating to form silicon oxide to obtain a mixture and firing the mixture in a vacuum or a non-oxidizing atmosphere at 1200 to 1900° C.

8 Claims, 1 Drawing Sheet

OXYNITRIDE-BASED FLUORESCENT MATERIAL AND METHOD FOR PRODUCTION THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Applications No. 60/617,072 filed Oct. 12, 2004 and Japanese Applications No. 2004-284018 filed Sep. 29, 2004 pursuant to 35 U.S.C §111(b).

TECHNICAL FIELD

This invention relates to an oxynitride-based fluorescent material optically activated with a rare earth element. More particularly, this invention relates to an oxynitride-based fluorescent material which is capable of imparting enhanced luminance to a white light-emitting diode (white LED) using a blue light-emitting diode (blue LED) or an ultraviolet light-emitting diode (ultraviolet LED) as the light source.

BACKGROUND ART

The light-emitting diode (LED) is a semiconductor solid-state light-emitting device formed by joining a p-type semiconductor and an n-type semiconductor. The LED has been serving as the light source for various kinds of devices because it possesses strong points, such as a long service life, an excellent shock resistance, a lower power consumption and high reliability, and moreover permits a reduction in volume, thickness and light. Particularly, the white LED is now used for warning illuminations which are expected to be reliable, on-vehicle illuminations and liquid crystal backlights which are preferred to promise reduction in volume and weight, and railroad guide plates which are necessitated to ensure visual recognition. It is also expected to find application to general household indoor illuminations.

When an electric current is fed in the forward direction to the p-n junction formed of a direct transition type semiconductor, the electrons and the holes are combined and the light having a peak wavelength corresponding to the forbidden band width of the semiconductor is emitted. Since the emission spectrum of the LED generally has a narrow half-band width of the peak wavelength, the luminescent color of the white LED is acquired exclusively by the principle of the color mixture of light.

For the production of a white color, specifically the following methods have been known.

(1) A method which consists in combining three kinds of LEDs emitting the three primary colors of light, i.e. red color (R), green color (G) and blue color (B), respectively, and mixing the lights of these LEDs.

(2) A method which consists in combining an ultraviolet LED emitting an ultraviolet light and three kinds of fluorescent materials emitting the fluorescences of red color (R), green color (G) and blue color (B), respectively, in response to the excitation by the ultraviolet light and mixing the fluorescences of the three colors emitted from the fluorescent materials.

(3) A method which consists in combining a blue LED emitting a blue light and a fluorescent material emitting a yellow fluorescence having the relationship of a complementary color with the blue light and mixing the blue LED light and the yellow light emitted from the fluorescent material.

A method which obtains a prescribed luminescent color by using a plurality of LEDs necessitates a special circuit for regulating the electric currents of the individual LEDs for the purpose of balancing the relevant colors. In contrast thereto, a method which obtains a prescribed luminescent color by combining an LED and a fluorescent material is at an advantage in obviating the necessity for such a circuit and allowing a reduction in the cost of the LED. Regarding the fluorescent materials of the kind utilizing the LED as a light source, various proposals have been made to date.

For example, a YAG fluorescent material having a YAG-based oxide host crystal represented by the constitutional formula, $(Y, Gd)_3(Al, Ga)_5O_{12}$, doped with Ce has been disclosed (refer to Takashi Mukai et al, Applied Physics, Vol. 68, No. 2 (1999), pp. 152-155). This prior art describes the fact that when the first surface of an InGaN-based blue LED chip is coated with a thin layer of a YAG fluorescent material, the blue light emitted from the blue LED and the fluorescence of a peak wavelength of 550 nm emitted from the YAG fluorescent material in response to the excitation by the blue light are mixed to give rise to a white light.

Then, a white LED combining a light-emitting device, such as a nitride-based compound semiconductor capable of emitting an ultraviolet light, and fluorescent materials emitting lights in response to the excitation by the ultraviolet light has been disclosed. As the fluorescent materials to be used herein, a compound $(Sr, Ca, Ba)_{10}(PO_4)_6C_{12}$:Eu emitting a blue light, a compound $3(Ba, Mg, Mn)O8Al_2O_3$:Eu emitting a green light and a compound $Y_2O_2S$:Eu emitting a red light are disclosed (refer to JP-A 2002-203991).

The existing fluorescent materials generally have a weak point that the spectrum intensity is allayed conspicuously when the excitation wavelength surpasses the near ultraviolet zone.

The white LED obtained by coating the first surface of the InGaN-based blue LED chip with a fluorescent material formed of a YAG-based oxide has been reputed as incurring difficulty in forming a white LED of high luminance because the excitation energy of the YAG-based oxide which is a fluorescent material and the excitation energy of the blue LED as the light source do not coincide and the excitation energy is not converted with high efficiency.

Further, in the case of the white LED which is formed by combining a light-emitting device, such as a nitride-based compound semiconductor capable of emitting an ultraviolet light, and a fluorescent material emitting light in response to the excitation by the ultraviolet light, this white LED has been reputed as incurring difficulty in obtaining a white color of high luminance because the luminous efficiency of the fluorescent material of the red component is appreciably low as compared with that of any other fluorescent material and consequently the mixing ratio of this fluorescent material is proportionately large.

This invention is aimed at providing an oxynitride-based fluorescent material which permits impartation of enhanced luminance to a white light-emitting diode (white LED) using a blue light-emitting diode (blue LED) or an ultraviolet light-emitting diode (ultraviolet LED) as the light source and a light-emitting device using the fluorescent material.

The present inventor has pursued a diligent study with a view to accomplishing the object mentioned above and has consequently found that an oxynitride-based fluorescent material resulting from substituting Eu for part of M in the general formula $M_3Si_2N_2O_4$ (wherein M denotes one or more elements selected from among Be, Mg, Ca, Sr and Ba) possesses a strong absorption band in a wide range extending over ultraviolet to near ultraviolet to visible light. He has found anew that the white LED using the fluorescent material of this invention possesses an excellent light-emitting property. This invention has been perfected as a result.

DISCLOSURE OF THE INVENTION

The present invention provides as the first aspect thereof an oxynitride-based fluorescent material formed of what results from substituting Eu for part of M of a general formula $M_3Si_2N_2O_4$, wherein M denotes one or more elements selected from among Be, Mg, Ca, Sr and Ba.

In the second aspect of the invention that includes the first aspect, the oxynitride-based fluorescent material has an elemental ratio of Eu/M in a range of 0.01 to 50 at %.

In the third aspect of the invention that includes the first or second aspect, the oxynitride-based fluorescent material has an average particle diameter of 50 μm or less.

In the fourth aspect of the invention that includes any one of the first to third aspects, the oxynitride-based fluorescent material has a bivalent europium ratio of 50% or more.

In the fifth aspect of the invention that includes any one of the first to fourth aspects, the oxynitride-based fluorescent material has a bivalent europium ratio of 80% or more.

The invention further provides as the sixth aspect thereof a method for the production of the oxynitride-based fluorescent material according to any one of the first to fifth aspects, which method comprises mixing oxides of Be, Mg, Ca, Sr, Ba and Eu, or compounds of Be, Mg, Ca, Sr, Ba and Eu enabled by heating to form oxides, silicon oxide or a compound enabled by heating to form silicon oxide, and silicon nitride or a compound enabled by heating to form silicon nitride to obtain a mixture and firing the mixture in a vacuum or a non-oxidizing atmosphere at a temperature of 1200 to 1900° C.

The invention further provides as the seventh aspect thereof a method for the production of the oxynitride-based fluorescent material according to any one of the first to fifth aspects, which method comprises mixing oxides of Be, Mg, Ca, Sr, Ba and Eu, or compounds of Be, Mg, Ca, Sr, Ba and Eu enabled by heating to form oxides, silicon oxide or a compound enabled by heating to form silicon oxide, and silicon nitride or a compound enabled by heating to form silicon nitride to obtain a mixture and firing the mixture in a presence of carbon or a carbon-containing compound in a vacuum or a non-oxidizing atmosphere at a temperature of 1200 to 1900° C.

The invention further provides as the eighth aspect thereof a method for the production of the oxynitride-based fluorescent material according to any one of the first to fifth aspects, which method comprises mixing oxides of Be, Mg, Ca, Sr, Ba and Eu, or compounds of Be, Mg, Ca, Sr, Ba and Eu enabled by heating to form oxides, silicon oxide or a compound enabled by heating to form silicon oxide, silicon nitride or a compound enabled by heating to form silicon nitride, and a seed of the oxynitride-based fluorescent material that is a final synthetic substance to obtain a mixture and firing the mixture in a vacuum or a non-oxidizing atmosphere at 1200 to 1900° C.

The invention further provides as the ninth aspect thereof a method for the production of the oxynitride-based fluorescent material according to any one of the first to fifth aspects, which method comprises mixing oxides of Be, Mg, Ca, Sr, Ba and Eu, or compounds of Be, Mg, Ca, Sr, Ba and Eu enabled by heating to form oxides, silicon oxide or a compound enabled by heating to form silicon oxide, silicon nitride or a compound enabled by heating to form silicon nitride, and a seed of the oxynitride-based fluorescent material that is a final synthetic substance to obtain a mixture and firing the mixture in a presence of carbon or a carbon-containing compound in a vacuum or a non-oxidizing atmosphere at 1200 to 1900° C.

The invention further provides as the tenth aspect thereof a light-emitting apparatus combining the oxynitride-based fluorescent material according to any one of the first to fifth aspects and a light-emitting element.

In the eleventh aspect of the invention that includes the tenth aspect, the light-emitting device is a nitride-based semiconductor light-emitting device, an emission wavelength of which is in a range of 250 nm to 500 nm.

The fluorescent material of this invention can be effectively applied to the operations of a white LED using an ultraviolet LED or a blue LED because it possesses an absorption band of a wide range extending over ultraviolet to near ultraviolet to visible light. It can enhance the luminance of the white LED because it has a strong absorption band.

The above and other objects, characteristic features and advantageous of the present invention will become apparent to those skilled in the art from the description to be made herein below with reference to the accompanying drawing.

BEST MODE FOR CARRYING OUT THE INVENTION

Figure 1:
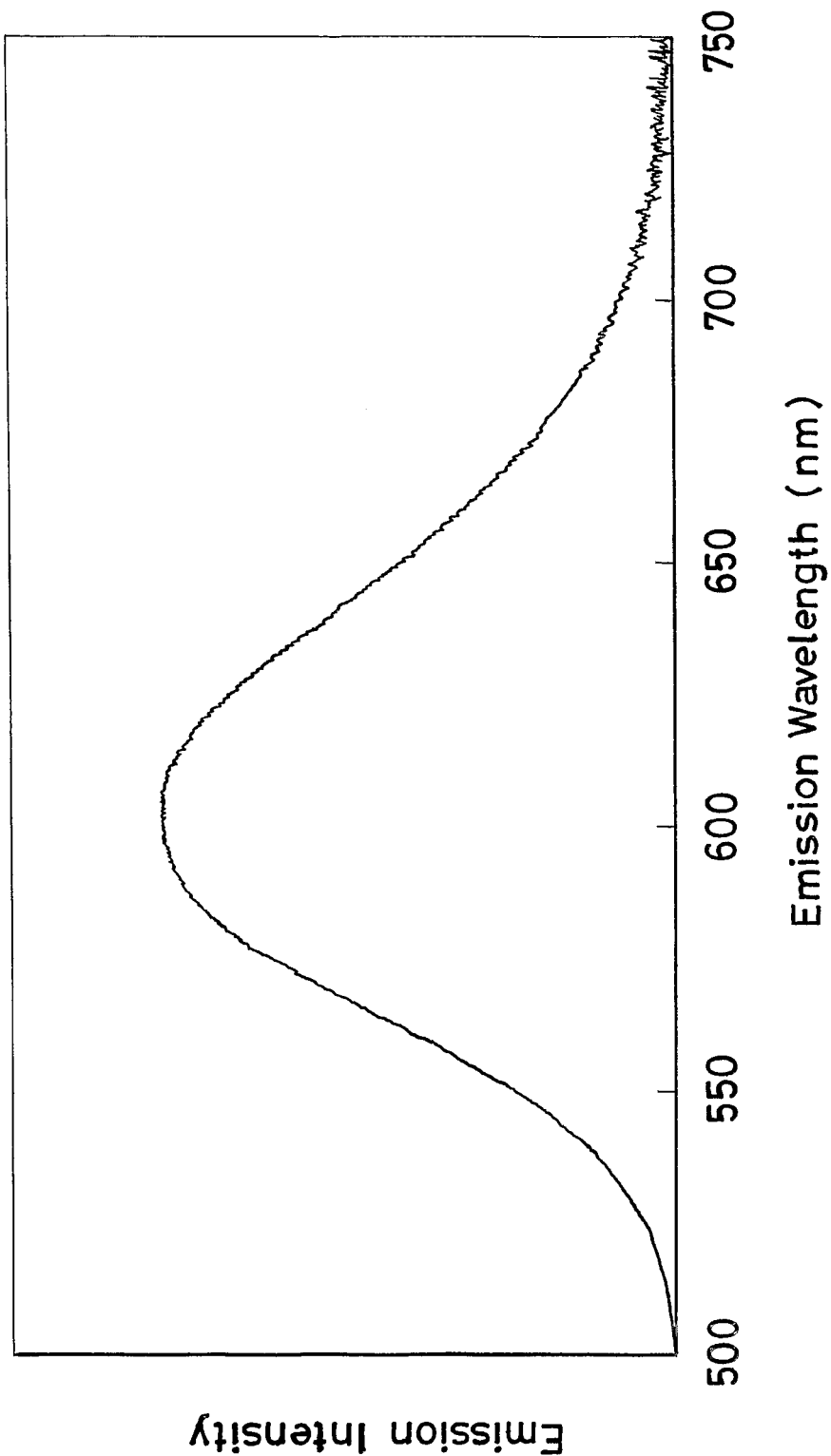
FIG. 1 is a graph showing the emission wavelength and the emission intensity which are obtained by exciting the fluorescent material of this invention by the use of a light-emitting diode.

The oxynitride fluorescent material of this invention, as described above, is an oxynitride-based fluorescent material formed of what has substituted Eu for part of M of the general formula $M_3Si_2N_2O_4$, wherein M denotes one or more members selected from among Be, Mg, Ca, Sr and Ba. Such compounds as $Be_3Si_2N_2O_4$, $Mg_3Si_2N_2O_4$, $Ca_3Si_2N_2O_4$, $Sr_3Si_2N_2O_4$, $Ba_3Si_2N_2O_4$, $(Be_a, Mg_b, Ca_c, Sr_d, Ba_e)_3Si_2N_2O_4$ (wherein a+b+c+d+e=1 and $0 \leq a<1$, $0 \leq b<1$, $0 \leq c<1$, $0 \leq d<1$ and $0 \leq e<1$) may be cited as concrete examples thereof Among other compounds enumerated above, $Mg_3Si_2N_2O_4$, $Ca_3Si_2N_2O_4$, $Sr_3Si_2N_2O_4$, $Ba_3Si_2N_2O_4$, $(Mg_a, Ca_b, Sr_c, Ba_d)_3Si_2N_2O_4$ (wherein a+b+c+d+e=1, $0 \leq a<1$, $0 \leq b<1$, $0 \leq c<1$ and $0 \leq d<1$) are preferable. The amount of Eu used for the substitution is preferably in the range of 0.01 to 50 at % (atom %). The average particle diameter of the fluorescent material is preferably 50 μm or less.

As the raw material compound for the oxynitride-based fluorescent material, the oxide of one or more members selected from the group consisting of Be, Mg, Ca, Sr and Ba or the compound of one or more members selected from the group consisting of Be, Mg, Ca, Sr and Ba and enabled by heating to form the oxide. As concrete examples of the raw material compound, beryllium oxide, magnesium oxide, calcium oxide, strontium oxide, barium oxide, beryllium carbonate, magnesium carbonate, calcium carbonate, strontium carbonate, barium carbonate, beryllium hydroxide, magnesium hydroxide, calcium hydroxide, strontium hydroxide, barium hydroxide, beryllium oxalate, magnesium oxalate, calcium oxalate, strontium oxalate, barium oxalate, beryllium sulfate, magnesium sulfate, calcium sulfate, strontium sulfate, barium sulfate, beryllium nitrate, magnesium nitrate, calcium nitrate, strontium nitrate, barium nitrate, beryllium acetate, magnesium acetate, calcium acetate, strontium acetate, barium acetate, dimethoxy beryllium, dimethoxy magnesium, dimethoxy calcium, dimethoxy strontium, dimethoxy barium, diethoxy beryllium, diethoxy magnesium, diethoxy calcium, diethoxy strontium, diethoxy barium, dipropoxy beryllium, dipropoxy magnesium, dipropoxy calcium, dipropoxy strontium, dipropoxy barium, dibutoxy beryllium, dibutoxy magnesium, dibutoxy calcium, dibutoxy strontium, dibutoxy barium, bis(dipivaloyl methanite) beryllium, bis(pivaloyl methanite) magnesium, vis (dipivaloyl methanite) calcium, bis(dipivloyl methanite) strontium, and bis(dipivloyl methanite) barium may be cited. One raw material compound selected from the group consisting of the compounds enumerated above may be used. A mixture, a complex oxide, a solid solution or a mixed crystal formed of two or more members selected from this group may be also used. Of these compounds, a carbonate or hydroxide is preferable, and what is particularly preferable is a carbonate.

Then, as the raw material compound of Eu, the oxide of Eu or the compound of Eu enabled by heating to form the oxide can be used. For example, one or more members selected from among europium oxide, europium carbonate, europium hydroxide, europium oxalate, europium sulfate, europium nitrate, europium acetate, trimethoxy europium, triethoxy europium, tripropoxy europium and tributoxy europium may be used. A mixture, a complex oxide, a solid solution or a mixed crystal formed of two or more members selected from this group may be also used.

As the raw material compound for silicon oxide, silicon oxide or a compound enabled by heating to form silicon oxide can be used. For example, one or more members selected from among silicon dioxide, silicon monoxide, tetramethoxy silane, tetraethoxy silane, tetrapropoxy silane, tetrabutoxy silane and tris(dimethylamino) silane may be used. A mixture, a solid solution or a mixed crystal formed of two or more members thereof can also be used.

As the raw material compound of silicon nitride, silicon nitride or a compound enabled by heating to form silicon nitride can be used. One or more members selected from among silicon diimide, polysilazane, etc. can be used. A similar result may be obtained by mixing one or more compounds selected from among silicon, silicon dioxide, silicon monoxide, tetramethoxy silane, tetraethoxy silane, tetrapropoxy silane, tetrabutoxy silane and tris(dimethylamino) silane optionally with carbon or a compound enabled by heating to form carbon and heating the resultant mixture in nitrogen or a nitrogen-containing non-oxidizing atmosphere. Of these materials, those in the form of a solid state are preferably pulverized into powder. Though the degree of particle size there of does not need to be particular restricted, finely pulverized powder is preferred because of excellence in reactivity. The purity of 90% or more is preferred.

The method for producing the oxynitride fluorescent material does not need to be particularly restricted. Any of the solid phase method, liquid phase method and vapor phase method may be adopted for the production. In the case of the solid phase production, the following method may be cited.

For a start, the raw material compounds are weighed out in desired ratios and mixed. A ball mill can be used when this mixing is performed. Though a dry-mixing can be adopted when using a ball mill, a wet-mixing using ethanol, acetone, water, etc. can also be adopted. In order to enhance the reactivity of the raw material powder, the wet-mixing is desirable. When adopting the wet-mixing, mixed slurry obtained is dried and, when necessary, pulverized. At this point, the selected raw material compounds may be mixed with a flux which is optionally added. As the flux, the halogenide of an alkali metal or the halogenide of an alkaline earth metal can be used. It is added, for example, in an amount in the range of 0.01 to 1 part by weight based on 100 parts by weight of the raw material compounds of the fluorescent material.

A powdered oxynitride-based fluorescent material synthesized in advance may optionally be added to and mixed with the raw material compounds. The amount thereof to be added is in the range of 1 to 50 parts by weight based on 100 parts by weight of the raw material compounds of the fluorescent material.

The resultant raw material mixture is packed in a crucible made of alumina, calcia, magnesia, graphite or boron nitride and fired in a vacuum or a non-oxidizing atmosphere at 1200 to 1900° C. for several hours. The non-oxidizing atmosphere, when necessary, may be pressed. Here, the non-oxidizing atmosphere is referred to an atmosphere of nitrogen, nitrogen-hydrogen, ammonium, argon, etc.

In the fluorescent material of this invention, europium exhibits ideal emission when it is in the form of plus bivalence. Since the europium oxide which is used as the raw material is trivalent, it must be reduced by the process of firing. The ratio of the bivalence and the trivalence gains in preferability in accordance as the bivalence increases. The ratio of the bivalence to the whole europium is preferably 50% or more. It is more preferably 80% or more. In the fluorescent material of this invention, since europium is added by replacing the site of a bivalent alkaline earth metal, the residue of trivalent europium, if any, will disrupt the balance of electric charge and induce degradation of the intensity of emission. The ratio of the bivalent europium and trivalent europium can be analyzed by the Moessbauer spectroscopy.

When the raw material mixture is fired in the presence of carbon or a carbon-containing compound, the reduction of europium oxide is expedited. The carbon or the carbon-containing compound which is used herein does not need to be particularly restricted but is required to be amorphous carbon, graphite or silicon carbide, for example. It is preferably amorphous carbon or graphite. Carbon black, powdered graphite, activated carbon, powdered silicon carbide, molded products thereof and sinters thereof may be cited as concrete examples. The same effect can be obtained from any of these. As regards the mode of the presence, the case of using a crucible which is made of carbon or a carbon-containing compound, the case of having carbon or a carbon-containing compound disposed inside or outside a crucible which is made of a material other than carbon or a carbon-containing compound, and the case of using a heating unit or an insulating unit which is made of carbon or a carbon-containing compound may be cited as concrete examples. These methods of disposition bring the same effect, no matter which of them may be actually adopted. The carbon or the carbon-containing compound intended for the presence is used appropriately in an amount approximately equimolar to the amount of europium oxide in the raw material mixture when powdered carbon is contained in the raw material mixture and this mixture is fired in an atmosphere of nitrogen, for example.

The product of the firing is cooled, then optionally subjected to a dispersing and pulverizing treatment with a ball mill, further subjected optionally to a treatment of water washing, and passed through the steps of solid-liquid separation, drying, crushing and classification to give rise to the fluorescent material of this invention.

The fluorescent material of this invention is excited fully efficiently with an ultraviolet light or a visible light having a wavelength in the range of 250 nm to 500 nm and, therefore, can be effectively applied to the white LED services using an ultraviolet LED or a blue LED.

The fluorescent material which is one preferred embodiment of this invention may be combined with a semiconductor light-emitting device which emits light in a wavelength zone from 250 nm through 500 nm to configure a light-emitting apparatus. In this case, as the light-emitting device various semiconductor, such as of ZnSe or GaN can be cited. It can be used infinitely so long as it is capable of emitting light at an emission spectrum in the range of 250 nm through 500 nm. From the viewpoint of efficiency, the gallium nitride-based semiconductor light-emitting elements are preferably used. The light-emitting device can be obtained by depositing a gallium nitride-based semiconductor on a substrate using the MOCVD method, HVPE method, etc. Preferably, $In_\alpha Al_\beta Ga_{1-\alpha-\beta}N$ (wherein $0 \leq \alpha$, $0 \leq \beta$ and $\alpha+\beta \leq 1$) is used as a light-emitting layer. As regards the structure of the semiconductor, the homostructures possessing a MIS junction, a PIN junction or a p-n junction, the heterostuctures, and the double heterostructures may be cited. A varying emission wavelength can be selected, depending on the material of a semiconductor layer and the degree of mixed crystal thereof. The single quantum well structure having a semiconductor active layer formed in a thin film generating a quantum effect and the multiple quantum well structure are similarly available.

The aforementioned fluorescent material layer to be disposed on the light-emitting device may result from having at least one kind of a fluorescent material deposited in a single layer or stacked in a plurality of layers or having plural kinds of fluorescent materials disposed as mixed in a single layer. As concrete examples of the mode of disposing the fluorescent material layer on the aforementioned light-emitting device, the mode of having the fluorescent material incorporated in advance in the coating member destined to coat the first surface of the light-emitting device, the mode of having the fluorescent material incorporated in the molding member, the mode of having the fluorescent material incorporated in advance in the coating material destined to cover the molding member, and further the mode of disposing a transparent plate having the fluorescent material incorporated in advance therein in front of the light-projecting side of the LED lamp may be cited.

The aforementioned fluorescent material may have at least one kind of fluorescent material incorporated in advance in the mold member on the light-emitting device. Further, the aforementioned fluorescent material layer formed of at least one kind of fluorescent material may be disposed on the outside of the light-emitting diode. As concrete examples of the mode of disposing the fluorescent material layer on the outside of the light-emitting diode, the mode of applying the fluorescent material in the form of a layer to the outer side surface of the mold member of the light-emitting diode, the mode of preparing a molded material (as in the shape of a cap) having a fluorescent material dispersed in rubber, resin, elastomer or a low-melting glass and coating the LED with this molded material, and the mode of converting the molded material mentioned above into a flat plate and disposing this flat plate in front of the LED may be cited.

Also, the mold member may have incorporated therein diffusion agents, such as titanium oxide, titanium nitride, tantalum nitride, aluminum oxide, silicon oxide, barium titanate, germanium oxide, mica, hexagonal boron nitride, or mica coated with white powder of titanium oxide, aluminum oxide, silicon oxide, barium titanate, germanium oxide or hexagonal boron nitride, or hexagonal boron nitride coated with white powder of titanium oxide, aluminum oxide, silicon oxide, barium titanate, germanium oxide, etc.

This invention will be explained below with reference to examples. This invention is not limited to the examples. Incidentally, in the following examples, the emission spectra were determined by an instrument made by Nippon Bunko K.K. and sold under the product code of "FP-6500."

Example 1

As component raw materials for a fluorescent material, 4.82 g of powdered europium oxide, 5.49 g of powdered silicon oxide, 12.82 g of powdered silicon nitride, and 76.83 g of powdered strontium carbonate were accurately weighed out and they were uniformly mixed with a ball mill by the wet method using ethanol to obtain slurry. The slurry is dried and crushed to give rise to a raw material mixture. Then, the resultant raw material mixture was placed in a crucible made of graphite, then disposed in a reactor core tube and fired therein in a current of nitrogen at a temperature of 1550° C. for six hours. The resultant fired material was finely pulverized with a ball mill and classified to give rise to a fluorescent material having an average particle diameter of 4.5 μm. When this fluorescent material was examined with an X-ray diffractometer and an electron beam microanalyzer, it was identified as $Sr_{2.85}Eu_{0.15}Si_2N_2O_4$. When this fluorescent material was excited at 380 nm to emit light, it was found to emit light of a color corresponding to yellowish orange. The emission spectrum of this fluorescent material is shown in FIG. 1. In FIG. 1, the horizontal axis is the scale of emission wavelength (nm) of the fluorescent material and the vertical axis the scale of the emission spectrum intensity (arbitrary scale).

Example 2

When the fluorescent material obtained in Example 1 was excited at 450 nm to emit light, it was found to emit light of a color corresponding to yellow.

Example 3

The fluorescent material obtained in Example 1 was mixed in a ratio of 20 mass % with silicone rubber. The resultant mixture was molded in the shape of a cap with a heating press. When this cap was so disposed as to cover the outside of a near ultraviolet LED having an emission wavelength of 380 nm and caused to emit light, it was found to emit light of a color corresponding to yellowish orange. Even after the LED had been lit for 500 hours under the conditions of 60° C. of temperature and 90% of RH (relative humidity), no change ascribable to the fluorescent material was recognized.

Example 4

A white LED manufactured by mixing the fluorescent material obtained in Example 1 and $Sr_5(PO_4)_3Cl:Eu$ as a blue light-emitting fluorescent material in respective ratios of 5.7 mass % and 9.0 mass % in silicone rubber and mounting the resultant mixture on a 380-nm near ultraviolet light emitting device and a white LED manufactured by mixing $Y_2O_2S:Eu$ as a red light-emitting fluorescent material, $Sr_5(PO_4)_3Cl:Eu$ as a blue light-emitting fluorescent material, $BaMg_2Al_{16}O_{27}:Eu, Mn$ as a green light-emitting fluorescent material in respective ratios of 45.8 mass %, 3.8 mass % and 3.4 mass % and mounting the resultant mixture on a 380-nm near ultraviolet light-emitting device were compared. Consequently, the sample using the fluorescent material obtained in Example 1 and $Sr_5(PO_4)_3Cl:Eu$ as a blue light-emitting fluorescent material was found to produce white light possessing 1.8 times as high luminance as the other sample.

Example 5

A white color LED was manufactured by mixing the fluorescent material obtained in Example 1 in a ratio of 9.1 mass % in epoxy resin and mounting the resultant mixture on a 450-nm blue light-emitting device. The white light emitted by this white LED was found to have a luminous efficiency of 36 (lm/W).

Example 6

A fluorescent material was obtained by following the procedure of Example 1 while as component raw materials for a fluorescent material, 3.83 g of powdered europium oxide, 4.36 g of powdered silicon oxide, 10.18 g of powdered silicon nitride and 81.63 g of powdered barium carbonate were accurately weighed out and the firing temperature was set to be 1500° C. When this fluorescent material was excited at 380 nm to emit light, it was found to emit light of a color corresponding to bluish green.

Example 7

When the fluorescent material obtained in Example 6 was excited at 450 nm to emit light, it was found to emit light of a color corresponding to bluish green in the same manner as in Example 6.

Example 8

A fluorescent material was obtained by following the procedure of Example 1 while as component raw materials for a fluorescent material, 4.27 g of powdered europium oxide, 4.86 g of powdered silicon oxide, 11.35 g of powdered silicon nitride, 34.03 g of powdered strontium carbonate and 45.49 g of powdered barium carbonate were accurately weighed out. When the fluorescent material was excited at 450 nm to emit light, it was found to emit light of a color corresponding to yellowish green.

Example 9

When the fluorescent material obtained in Example 8 was excited at 380 nm to emit light, it was found to emit light of a color corresponding to yellowish green in the same manner as in Example 8.

Example 10

A fluorescent material was obtained by following the procedure of Example 1 while as component raw materials for a fluorescent material, 5.14 g of powdered europium oxide, 5.85 g of powdered silicon oxide, 13.66 g of powdered silicon nitride, 13.89 g of powdered calcium carbonate and 61.46 g of strontium carbonate were accurately weighed out. When the fluorescent material was excited at 450 nm to emit light, it was found to emit light of a color corresponding to orange.

Example 11

Where the fluorescent material obtained in Example 10 was excited at 380 nm to emit light, it was found to emit light of a color corresponding to orange in the same manner as in Example 10.

Example 12

A fluorescent material was obtained by following the procedure of Example 1 while as component raw materials for a fluorescent material, 5.50 g of powdered europium oxide, 6.26 g of powdered silicon oxide, 14.63 g of powdered silicon nitride, 29.74 g of powdered calcium carbonate and 43.87 g of powdered strontium carbonate were accurately weighed out. When the fluorescent material was excited at 450 nm to emit light, it was found to emit light of a color corresponding to orangish red.

Example 13

When the fluorescent material obtained in Example 12 was excited at 380 nm to emit light, it was found to emit light of a color corresponding to orangish red in the same manner as in Example 12.

Example 14

A fluorescent material was obtained by following the procedure of Example 1 while as component raw materials for a fluorescent material, 6.41 g of powdered europium oxide, 7.29 g of powdered silicon oxide, 17.03 g of powdered silicon nitride and 69.26 g of powdered calcium carbonate were accurately weighed out. When the fluorescent material was excited at 450 nm to emit light, it was found to emit light of a color corresponding to red.

Example 15

When the fluorescent material obtained in Example 14 was excited at 380 nm to emit light, it was found to emit light of a color corresponding to red in the same manner as in Example 14.

Example 16

A fluorescent material was obtained by following the procedure of Example 1 while as component raw materials for a fluorescent material, 4.82 g of powdered europium oxide, 5.49 g of powdered silicon oxide, 12.82 g of powdered silicon nitride and 76.87 g of powdered strontium carbonate were accurately weighed out and uniformly mixed by the dry method using an agate mortar. When the fluorescent material was excited at 450 nm to emit light, it was found to emit light of a color corresponding to yellowish orange.

Comparative Example 1

A fluorescent material was obtained by following the procedure of Example 1 while as component raw materials for a fluorescent material, 6.55 g of powdered europium oxide, 7.46 g of powdered silicon oxide, 17.41 g of powdered silicon nitride and 68.58 g of powdered strontium nitride were accurately weighed out and uniformly mixed with a ball mill by the wet method using ethanol, the slurry obtained was dried and crushed to give rise to a raw material mixture. When the fluorescent material was excited at 450 nm, it was found to emit no light.

Comparative Example 2

A fluorescent material was obtained by following the procedure of Example 1 while as component raw materials for a fluorescent material, 6.55 g of powdered europium oxide, 7.46 g of powdered silicon oxide, 17.41 g of powdered silicon nitride and 68.58 g of powdered strontium nitride were accurately weighed out and uniformly mixed by the dry method using an agate mortar to give rise to a raw material mixture. When the fluorescent material was excited at 450 nm to emit light, it was found to emit light of a color corresponding to yellowish orange while the emission intensity was 41% as compared with that of the fluorescent material of Example 16.

Comparative Example 3

A fluorescent material was obtained by following the procedure of Example 1 while as component raw materials for a fluorescent material, 4.82 g of powdered europium oxide, 5.49 g of powdered silicon oxide, 12.82 g of powdered silicon nitride and 76.87 g of powdered strontium carbonate were accurately weighed out and uniformly mixed with a ball mill by the wet method using ethanol, the slurry obtained was dried and crushed to give rise to a raw material mixture, which was placed in a crucible made of alumina, then disposed in a reactor core tube and fired therein in a current of nitrogen at a temperature of 1550° C. for six hours. When the fluorescent material was excited at 450 nm to emit light, it was found to emit light of a color corresponding to yellowish orange while the emission strength was 53% as compared with that of the fluorescent material of Example 1.

Comparative Example 4

A fluorescent material was obtained by following the procedure of Example 1 while as component raw materials for a fluorescent material, 4.82 g of powdered europium oxide, 5.49 g of powdered silicon oxide, 12.82 g of powdered silicon nitride, and 76.87 g of powdered strontium carbonate were accurately weighed out and uniformly mixed with a ball mill by the wet method using ethanol, the slurry obtained was dried and crushed to give rise to a raw material mixture, which was placed in a crucible made of boron nitride and disposed in a reactor core tube made of alumina and fired therein in a current of nitrogen at a temperature of 1550° C. for six hours. When the fluorescent material was excited at 450 nm to emit light, it was found to emit light of a color corresponding to yellowish orange while the emission strength was 61% as compared with that of the fluorescent material of Example 1.

Example 17

A fluorescent material was obtained by following the procedure of Example 1 while as component raw materials for a fluorescent material, 4.82 g of powdered europium oxide, 5.49 g of powdered silicon oxide, 12.82 g of powdered silicon nitride and 76.87 g of powdered strontium carbonate were accurately weighed out and uniformly mixed with a ball mill by the wet method using ethanol, the slurry obtained was dried and crushed to give rise to a raw material mixture, which was placed in a crucible made of alumina and disposed in a reactor core tube made of alumina together with a graphite piece and fired therein in a current of nitrogen at a temperature of 1550° C. for six hours. When the fluorescent material was excited at 450 nm to emit light, it was found to emit light of a color corresponding to yellowish orange and the emission strength was at the same level as in Example 1.

Example 18

A fluorescent material was obtained by following the procedure of Example 1 while as component raw materials for a fluorescent material, 4.82 g of powdered europium oxide, 5.49 g of powdered silicon oxide, 12.82 g of powdered silicon nitride and 76.87 g of powdered strontium carbonate were accurately weighed out and uniformly mixed with a ball mill by the wet method using ethanol, the slurry obtained was dried and crushed to give rise to a raw material mixture, which was placed in a crucible made of alumina together with a graphite piece and disposed in a reactor core tube made of alumina and fired therein in a current of nitrogen at a temperature of 1550° C. for six hours. When the fluorescent material was excited at 450 nm to emit light, it was found to emit light of a color corresponding to yellowish orange and the emission strength was at the same level as in Example 1.

Example 19

A fluorescent material was obtained by following the procedure of Example 1 while as component raw materials for a fluorescent material, 4.82 g of powdered europium oxide, 5.49 g of powdered silicon oxide, 12.82 g of powdered silicon nitride and 76.87 g of powdered strontium carbonate were accurately weighed out and uniformly mixed with a ball mill by the wet method using ethanol, the slurry obtained was dried and crushed to give rise to a raw material mixture, which was placed in a crucible made of alumina and disposed in an internal heat-type firing furnace using a graphite heater and fired therein in a current of nitrogen at a temperature of 1550° C. for six hours. When the fluorescent material was excited at 450 nm to emit light, it was found to emit light of a color corresponding to yellowish orange and the emission strength was at the same level as in Example 1.

Example 20

A fluorescent material was obtained by following the procedure of Example 1 while as component raw materials for a fluorescent material, 4.82 g of powdered europium oxide, 5.49 g of powdered silicon oxide, 12.82 g of powdered silicon nitride, 76.87 g of powdered strontium carbonate and 10.00 g of a target powered oxynitride fluorescent material were accurately weighed out and the firing temperature was set to be 1450° C. When the fluorescent material was excited at 450 nm to emit light, it was found to emit light of a color corresponding to yellowish orange and the emission strength was at the same level as in Example 1.

Example 21

The fluorescent materials obtained in Examples 1, 6, 8, 10, 12 and 14 were mixed in respective amounts of 4.7 mass %, 4.0 mass %, 4.7 mass %, 8.2 mass %, 12.1 mass % and 17.6 mass % in silicone rubber and mounted on a 380 nm-near ultraviolet light-emitting devices to fabricate white LEDs. The white LEDs were compared to find an average color rendering index of 91.

INDUSTRIAL APPLICABILITY

The combination of the fluorescent material of this invention as with a blue light-emitting diode results in emitting a white light, which can be utilized as an illuminating light source and a display light source.

The invention claimed is:

1. An oxynitride-based fluorescent material formed of what results from substituting Eu for part of M of a general formula $M_3Si_2N_2O_4$, wherein M denotes one or more elements selected from among Be, Mg, Ca, Sr and Ba.

2. An oxynitride-based fluorescent material according to claim 1, wherein it has an elemental ratio of Eu/M in a range of 0.01 to 50 at %.

3. An oxynitride-based fluorescent material according to claim 1, wherein it has an average particle diameter of 50 μm or less.

4. An oxynitride-based fluorescent material according to claim 1, wherein it has a bivalent europium ratio of 50% or more.

5. An oxynitride-based fluorescent material according to claim 1, wherein it has a bivalent europium ratio of 80% or more.

6. A light-emitting apparatus combining the oxynitride-based fluorescent material according to claim 1 and a light-emitting element.

7. A light-emitting apparatus according to claim 6, wherein the light-emitting device is a nitride-based semiconductor light-emitting device, an emission wavelength of which is in a range of 250 nm to 500 nm.

8. An oxynitride-based fluorescent material according to claim 1, wherein a ratio of bivalent europium to the whole europium is 50% or more.

* * * * *